(12) United States Patent  
Savla

(10) Patent No.: US 7,205,921 B1
(45) Date of Patent: Apr. 17, 2007

(54) HYBRID ANALOG-TO-DIGITAL CONVERTER

(75) Inventor: Anup Savla, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/390,025

(22) Filed: Mar. 27, 2006

(51) Int. Cl.
*H03M 1/12* (2006.01)
(52) U.S. Cl. .................... 341/155; 341/163
(58) Field of Classification Search ........ 341/155, 341/163
See application file for complete search history.

(56) References Cited

U.S. PATENT DOCUMENTS 6,396,429 B2 * 5/2002 Singer et al. ............... 341/155
7,002,501 B2 * 2/2006 Gulati et al. ............... 341/155

OTHER PUBLICATIONS

Johns, David A., et al., "Analog Integrated Circuits Design", *SAR ADC Description*, pp. 492-493, copyright 1997., (1997),492-293, no month.
Lewis, Stephen H., "A 10b 20-Msample/s Analog-to-Digital Converter", *IEEE Journal of Solid-State CiUnknownrcuits*, vol. 27, No. 3, (Mar. 1992),351-358.
Salva, Anup , "Digital Calibration Algorithms For Nyquist-Rate Analog to Digital Converters", pp. 68-69, 84-87 & 111-115, no date.

* cited by examiner

*Primary Examiner*—Peguy JeanPierre
(74) *Attorney, Agent, or Firm*—Douglas J. Ryder; Ryder IP Law, PC

(57) ABSTRACT

In general, in one aspect, the disclosure describes a hybrid analog-to-digital converter. The hybrid converter comprises a successive approximation analog-to-digital converter for receiving an analog input signal and generating at least one bit of a digital output signal and a cyclic analog-to-digital converter coupled to the analog input signal and the successive approximation analog-to-digital converter for generating at least one additional bit of the digital output signal.

20 Claims, 5 Drawing Sheets

|    | C1  | C2  | C3  | C4  | C5  | C6  | C7  | C8  | C9  |
|----|-----|-----|-----|-----|-----|-----|-----|-----|-----|
| R1 | $Sb0_1$ | $Sb1_1$ | 0 | 0 | 0 | 0 | 0 | 0 | 0 |
| R2 | 0 | $Sb0_2$ | $Sb1_2$ | 0 | 0 | 0 | 0 | 0 | 0 |
| R3 | 0 | 0 | $Sb0_3$ | $Sb1_3$ | 0 | 0 | 0 | 0 | 0 |
| R4 | 0 | 0 | 0 | $Cb0_4$ | $Cb1_4$ | 0 | 0 | 0 | 0 |
| R5 | 0 | 0 | 0 | 0 | $Cb0_5$ | $Cb1_5$ | 0 | 0 | 0 |
| R6 | 0 | 0 | 0 | 0 | 0 | $Cb0_6$ | $Cb1_6$ | 0 | 0 |
| R7 | 0 | 0 | 0 | 0 | 0 | 0 | $Cb0_7$ | $Cb1_7$ | 0 |
| R8 | 0 | 0 | 0 | 0 | 0 | 0 | 0 | $Cb0_8$ | $Cb1_8$ |
|    | $D_8$ | $D_7$ | $D_6$ | $D_5$ | $D_4$ | $D_3$ | $D_2$ | $D_1$ | $D_0$ |

FIG. 5

| n | Opr | Vin/Vin2 | Vcmp1 | Vmid/Vmid2 | Vcmp2 | Output |
|---|-----|----------|-------|------------|-------|--------|
| 1 | SAR | 600 | 625 | 500 | 375 | 0 1 |
| 2 | SAR | 600 | 563 | 500 | 437 | 1 0 |
| 3 | SAR | 600 | 656 | 625 | 593 | 0 1 |
| 4 | CYC | 475 | 516 | 500 | 484 | 0 0 |
| 5 | CYC | 513 | 516 | 500 | 484 | 0 1 |
| 6 | CYC | 525 | 516 | 500 | 484 | 1 0 |
| 7 | CYC | 488 | 516 | 500 | 484 | 0 1 |
| 8 | CYC | 475 | 516 | 500 | 484 | 0 0 |

FIG. 6

HYBRID ANALOG-TO-DIGITAL CONVERTER

BACKGROUND

Analog-to-digital converters (ADCs) are widely used in applications where an analog signal (e.g., voltage, current, temperature, pressure) must be converted to a digital signal (digital value) for processing by digital circuitry. In battery-powered portable equipment, especially wireless communications devices, ultra-low power ADCs are required to minimize battery drain.

Some of the more common architectures for ADCs include flash, successive approximation, sigma-delta, integrating, cyclic (also known as algorithmic), and pipelined. Each of these architectures offers a range of values within important operating parameters of speed, accuracy, and power. Each also offers trade-offs with regard to circuit size.

For example, successive approximation based ADCs with passive sampling usually achieve very low power operation since they avoid the use of active analog amplifiers. However, the speed and resolution of such converters is limited by mismatches in capacitor values and comparator accuracy. Redundancy-based digital correction algorithms may be used to increase speed and resolution of an ADC while reducing the mismatch and accuracy requirements. However, traditional digital correction algorithms are not directly applicable to the successive approximation ADC architecture because the residual signals must typically be amplified between conversion cycles in a redundancy-based digital correction scheme.

BRIEF DESCRIPTION OF THE DRAWINGS

The features and advantages of the various embodiments will become apparent from the following detailed description in which:

FIG. 5 illustrates an example output of a digital correction circuit (DCC), according to one embodiment; and FIG. 6 illustrates an example application of a hybrid ADC, according to one embodiment.

DETAILED DESCRIPTION

Figure 1A:
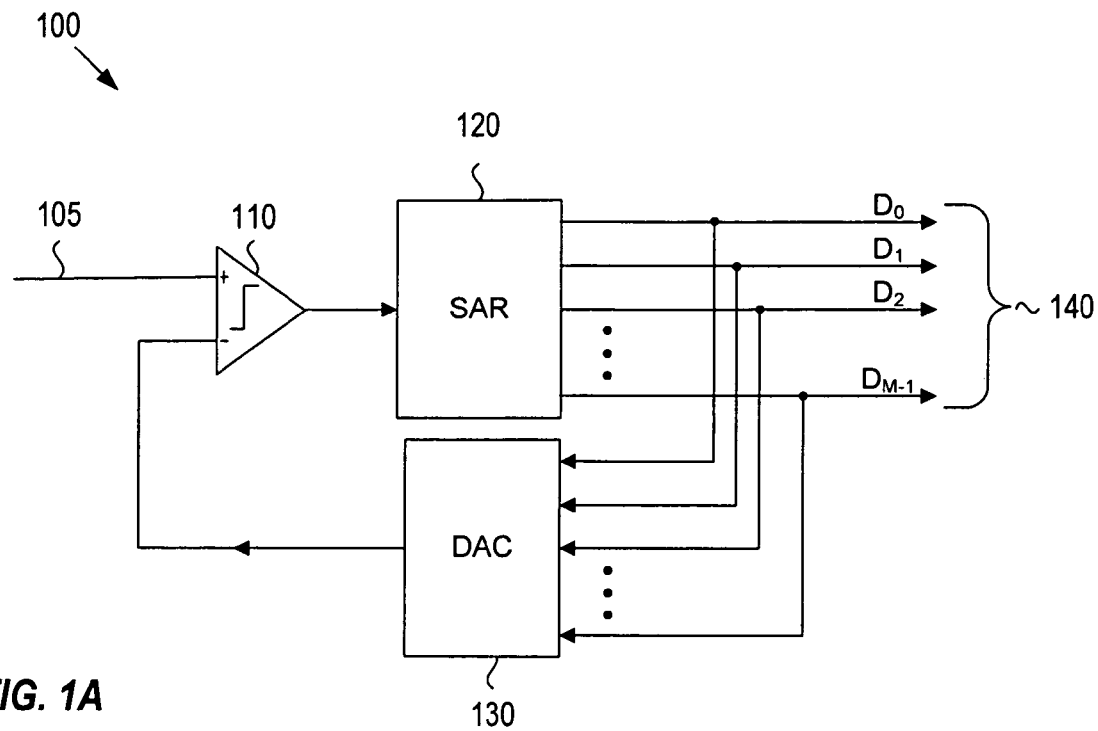
FIG. 1A illustrates an example block diagram of a successive approximation based analog-to-digital converter (ADC), according to one embodiment.

FIG. 1A illustrates an example block diagram of a successive approximation based analog-to-digital converter (ADC) 100. The ADC 100 includes a comparator 110, a successive approximation register (SAR) 120, and a digital-to-analog converter (DAC) 130. An analog input signal 105 is received by the comparator 110 and compared to a series of values generated by the SAR 120 and converted to an analog level by the DAC 130. A digital output 140 includes M output signals from $D_0$ (least-significant bit) through $D_{M-1}$ (most significant bit).

Figure 1B:
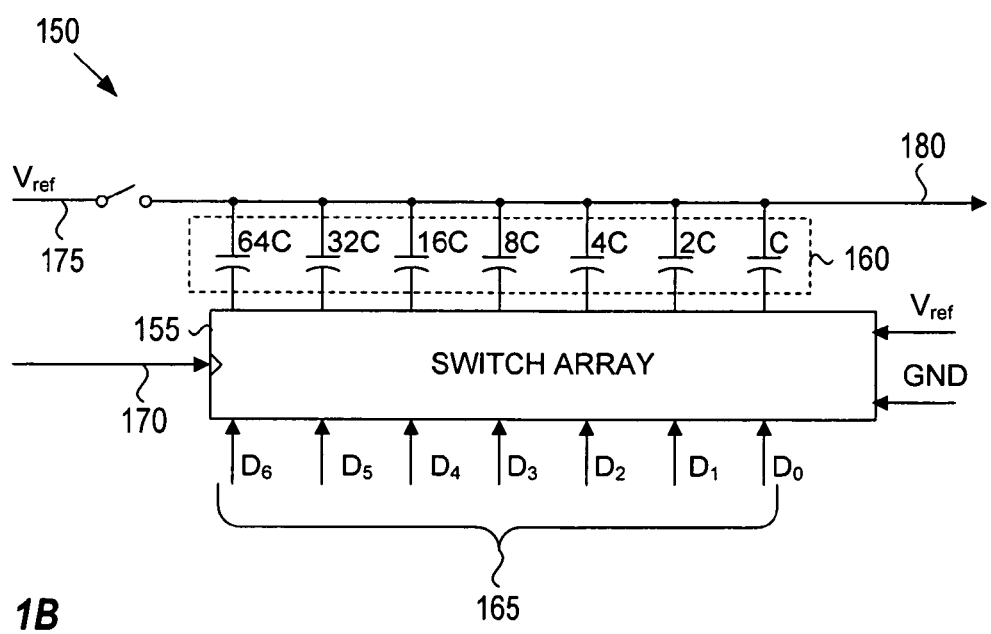
FIG. 1B illustrates an example simplified circuit of a 7-bit switched capacitor type digital-to-analog converter (DAC), according to one embodiment.

FIG. 1B illustrates an example simplified circuit of a 7-bit switched capacitor type DAC 150 (e.g., 130 of FIG. 1A). The DAC 150 includes a switch array 155 and a capacitor array 160. The switch array 155 receives digital inputs $D_0$–$D_6$ 165 (e.g., 140) that are used to control the switching of voltages to the capacitor array 160. A clock signal 170 provides a switching clock to the switch array 155 and a reference voltage ($V_{ref}$) 175 provides an accurate reference for the capacitor array 165. An analog output 180 is the analog equivalent of the digital inputs 165.

The speed and resolution of the ADC 100 is limited by the accuracy of the DAC 130 (mismatches in capacitor 160 values) and comparator 110 accuracy.

Figure 2:
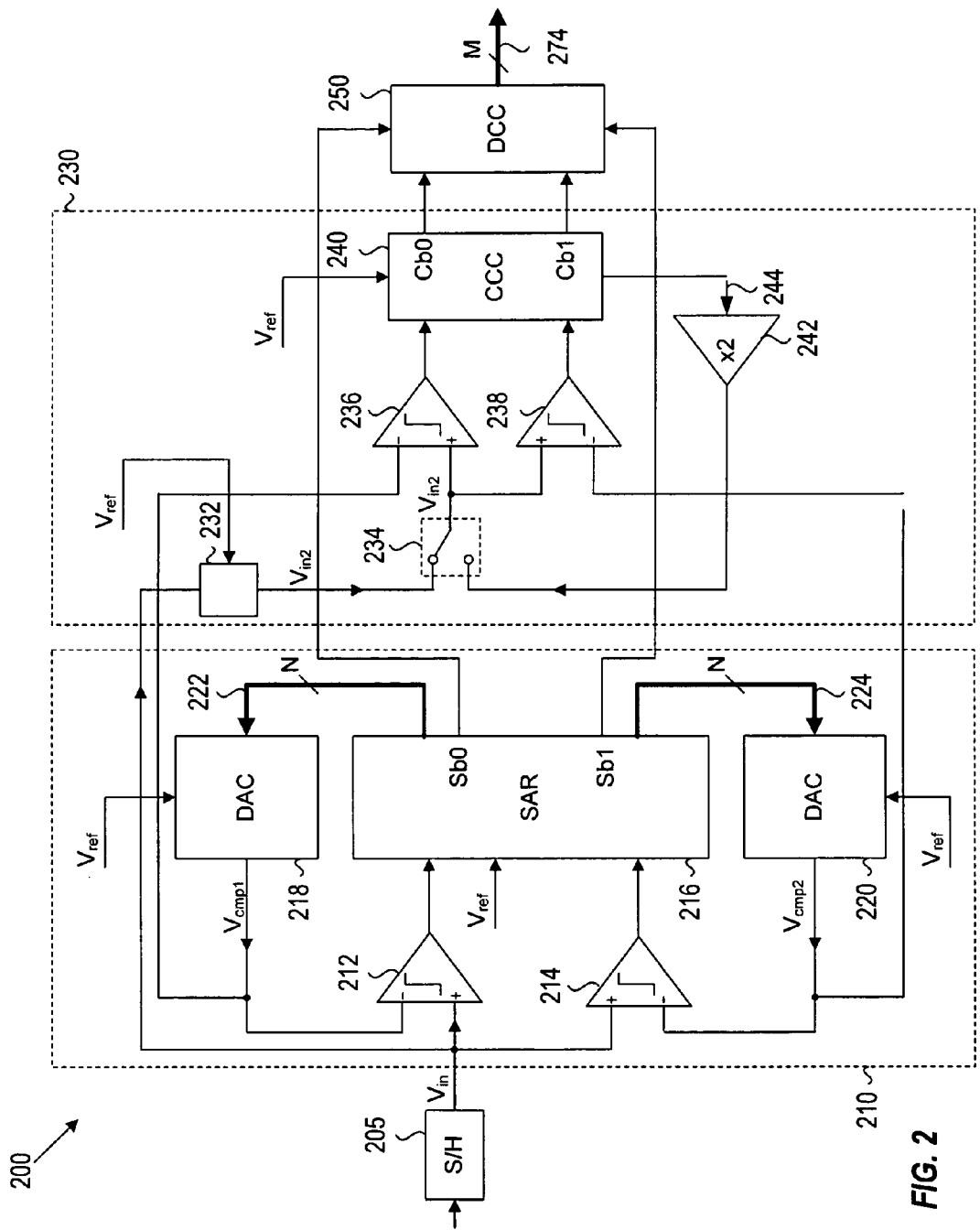
FIG. 2 illustrates an example hybrid ADC, according to one embodiment.

FIG. 2 illustrates an example hybrid ADC 200 that achieves high speed and resolution while maintaining very low power operation with relaxed mismatch and accuracy requirements for capacitive elements and comparators. The hybrid ADC 200 includes a successive approximation ADC 210, a cyclic ADC 230, and a digital correction circuit (DCC) 250. The hybrid ADC 200 converts an analog input signal into an M-bit digital signal (the digital signal has $2^M$ possible levels) using the successive approximation ADC 210 to generate one or more of the most significant bits of the digital output and the cyclic ADC 230 to generate the remaining bits. The DCC 250 may be used to process the bits generated by the two ADCs 210, 230 and create a corrected digital value.

The successive approximation ADC 210 includes two comparators 212, 214, a successive approximation register (SAR) 216, and two digital-to-analog converters (DAC) 218, 220. The cyclic ADC 230 includes a circuit 232, a switch 234, two comparators 236, 238, a cyclic controller circuit (CCC) 240, and a multiplier 242. The two comparators in each of the successive approximation ADC 210 and the cyclic ADC 230 enable implementation of a digital correction algorithm in the DCC 250.

An analog input is sampled and held by a sample/hold (S/H) 205. The output of the S/H 205 is an input voltage ($V_{in}$). $V_{in}$ is provided to the successive approximation ADC 210 as a first input of both a first comparator 212 and a second comparator 214. An output of both the first and second comparators 212, 214 is provided to the SAR 216. A precise reference voltage ($V_{ref}$) is also provided to the SAR 216. The SAR 216 may include registers and control logic for generating two digital output signals, Sb0 and Sb1. The digital output signals Sb0 and Sb1 may be provided to the DCC 250. The SAR 216 may also generate a first N-bit digital output 222 and a second N-bit digital output 224. The first N-bit digital output 222 is provided to a first DAC 218 and the second N-bit digital output 224 is provided to a second DAC 220. $V_{ref}$ is also provided to the first and second DACs 218, 220. The first and second DACs 218, 220 may be switched capacitor type digital-to-analog converters (e.g., like illustrated in FIG. 1B). An output of the first DAC 218 is a first comparator voltage level ($V_{cmp1}$) and an output of the second DAC 220 is a second comparator voltage level ($V_{cmp2}$). $V_{cmp1}$ is fed into a second input of the first comparator 212 and $V_{cmp2}$ is fed into a second input of the second comparator 214.

$V_{in}$ is also provided to the cyclic ADC 230 as an input to the circuit 232. The circuit 232 generates an initial value for a second input voltage ($V_{in2}$). The initial value for voltage $V_{in2}$ is applied through the switch 234 to a first input of both a first comparator 236 and a second comparator 238. A second input of the third comparator 236 is connected to the output of the first DAC 218 ($V_{cmp1}$) and a second input of the fourth comparator 238 is connected to the output of the second DAC 220 ($V_{cmp2}$). An output of both the first and second comparators 236, 238 is provided to the CCC 240. $V_{ref}$ is also fed into the CCC 240. The CCC 240 may include control logic for generating two digital output signals, Cb0 and Cb1. The digital output signals Cb0 and Cb1 may be fed into the DCC 250. The CCC 240 may also generate an analog output 244 that is fed to the multiplier 242. The multiplier 242 may multiple the analog output 244 by a factor (e.g., of two). An output of the multiplier 242 is provided to the switch 234. The switch 234 is operated such that the output of the multiplier 242 is provided to the first inputs of the third and fourth comparators 236, 238 for all cyclic ADC conversion cycles except the first cycle when $V_{in2}$ generated by the circuit 232 is provided.

Figure 3:
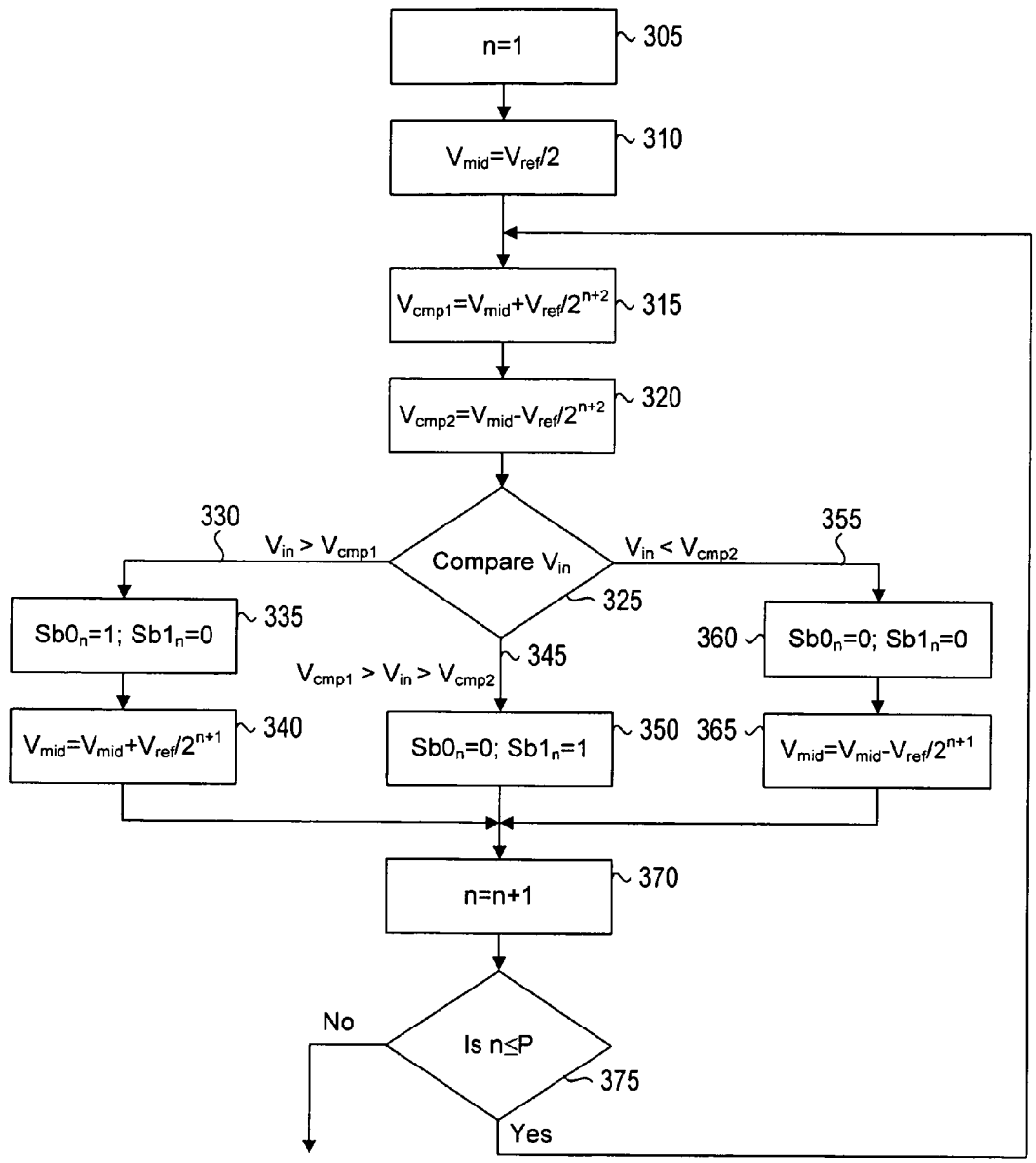
FIG. 3 illustrates an example operation of a successive approximation ADC, according to one embodiment.

FIG. 3 illustrates an example operation of a successive approximation ADC (e.g., 210 of FIG. 2). The successive approximation process begins with the initialization of an index variable "n" to 1 (305). A midpoint voltage level ($V_{mid}$) is computed as half of a reference voltage ($V_{ref}/2$) (310). A first comparator voltage level ($V_{cmp1}$) is computed by adding an incremental voltage ($V_{ref}/2^{n+2}$) to $V_{mid}$ (315). A second comparator voltage level ($V_{cmp2}$) is computed by subtracting $V_{ref}/2^{n+2}$ from $V_{mid}$ (320). An input voltage ($V_{in}$) is compared to $V_{cmp1}$ and $V_{cmp2}$ (325). The comparison may be performed by comparators (e.g., 212 and 214 of FIG. 2).

If $V_{in}$ is greater than $V_{cmp1}$ (330), then digital output signal $Sb0_n$ may be set to 1 and digital output signal $Sb1_n$ may be set to 0 (335) and $V_{mid}$ may be incremented by $V^{ref}/2^{n+1}$ (340). If $V_{in}$ is less than $V_{cmp1}$ but greater than $V_{cmp2}$ (345), then digital output signal $Sb0_n$ may be set to 0 and digital output signal $Sb1_n$ may be set to 1 (350) and $V_{mid}$ may not need to be adjusted. If $V_{in}$ is less than $V_{cmp2}$ (355), then both digital output signals $Sb0_n$ and $Sb1_n$ may be set to 0 (360) and $V_{mid}$ may be decrement by $V_{ref}/2^{n+1}$ (365).

After digital signals $Sb0_n$ and $Sb1_n$ are set and $V_{mid}$ is adjusted, if necessary, n is incremented by one (370) and then the incremented n is compared against a value "P" to determine if n is less than or equal to P (375). The value P is number of cycles to be executed by the successive approximation ADC. If n is less than or equal to P (375 Yes), then a next successive approximation cycle begins by adjusting $V_{cmp1}$ (315) and $V_{cmp2}$ (320). If n is greater than P (375 No), then the successive approximation cycles have been completed and processing continues with a cyclic ADC (FIG. 4).

Since SAR operation is applied only for P cycles the incremental voltage that the DAC will need to be accurate to will be limited to $V_{ref}/2^{n+2}$. If $V_{ref}$ was 1V, n was 8 and P was limited to 3, the capacitor matching would need to be 31.25 mV instead of 0.98 mV if the SAR was used for the entire n cycles.

Figure 4:
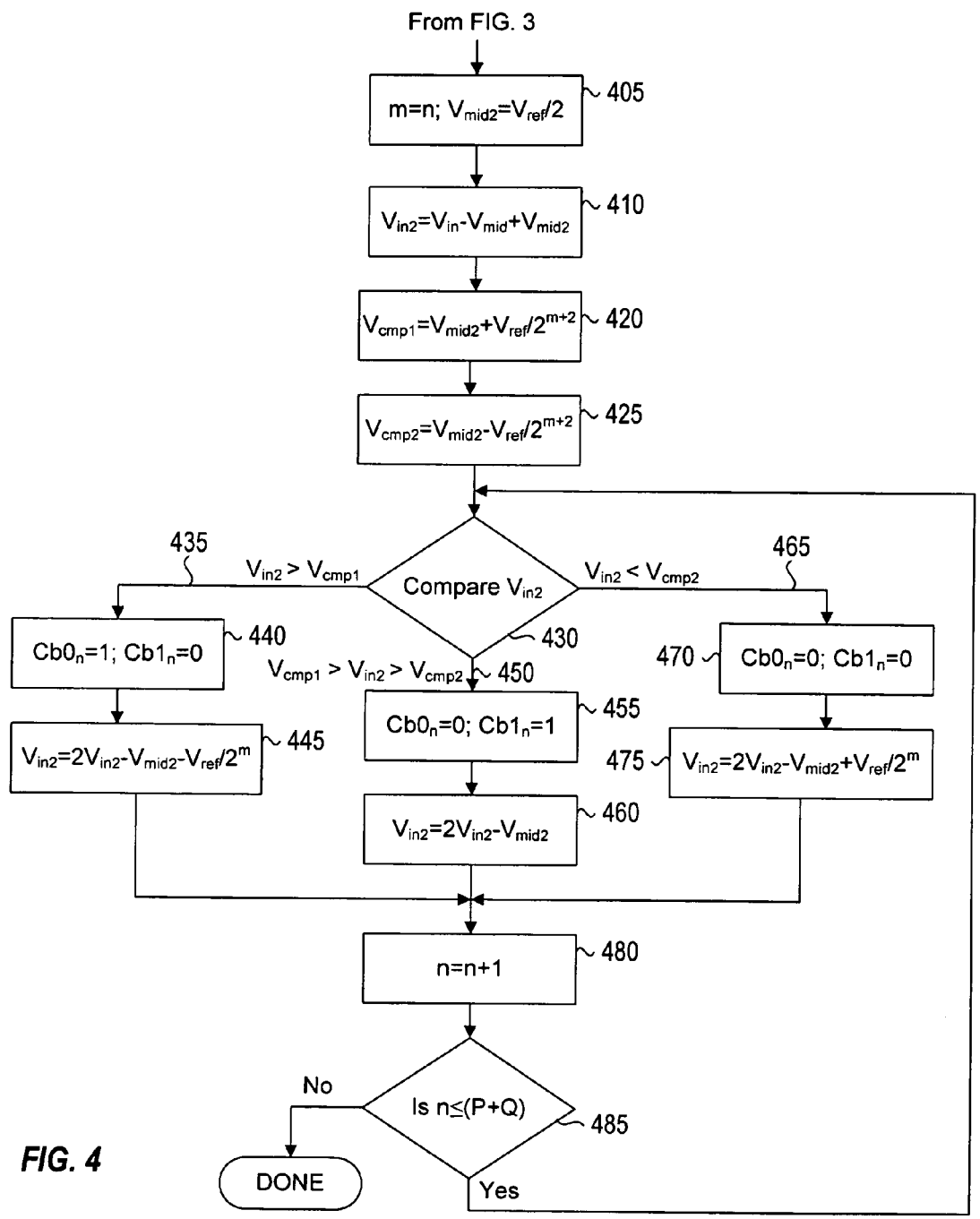
FIG. 4 illustrates an example operation of a cyclic ADC, according to one embodiment.

FIG. 4 illustrates an example operation of a cyclic ADC (e.g., 230 of FIG. 2). Initially, a value "m" is set to the index value n and a stationary midpoint voltage ($V_{mid2}$) is set to half of the reference voltage ($V_{ref}/2$) (405). These values are frozen for use during the cyclic conversion process. A second input voltage ($V_{in2}$) may be generated for a first cycle of the cyclic conversion process by subtracting $V_{mid}$ and adding $V_{mid2}$ to an input voltage ($V_{in}$) (410). $V_{mid}$ may be the last $V_{mid}$ value generated by the successive approximation process of FIG. 3. A first comparator voltage level ($V_{cmp1}$) may be computed by adding an incremental voltage ($V_{ref}/2^{m+2}$) to $V_{mid2}$ (420). A second comparator voltage level ($V_{cmp2}$) may be computed by subtracting $V_{ref}/2^{m+2}$ from $V_{mid2}$. $V_{cmp1}$ and $V_{cmp2}$ may be generated by a SAR (e.g., 216). $V_{cmp1}$ and $V_{cmp2}$ may be held for the duration of the cyclic conversion process.

$V_{in2}$ is compared to $V_{cmp1}$ and $V_{cmp2}$ (430). The comparison may be performed by comparators (e.g., 236 and 238 of FIG. 2). If $V_{in2}$ is greater than $V_{cmp1}$ (435), then digital output signal $Cb0_n$ may be set to 1 and digital output signal $Cb1_n$ may be set to 0 (440) and $V_{in2}$ may be adjusted by multiplying the previous value of $V_{in2}$ by 2 and subtracting $V_{mid2}$ and $V_{ref}/2^m$ (445). If $V_{in2}$ is less than $V_{cmp1}$ but greater than $V_{cmp2}$ (450), then digital output signal $Cb0_n$ may be set to 0 and digital output signal $Cb1_n$ may be set to 1 (455) and $V_{in2}$ may be adjusted by multiplying the previous value of $V_{in2}$ by 2 and subtracting $V_{mid2}$ (460). If $V_{in2}$ is less than $V_{cmp2}$ (465), then digital output signals $Cb0_n$ and $Cb1_n$ may be set to 0 (470), and $V_{in2}$ may be adjusted by multiplying the previous value of $V_{in2}$ by 2, subtracting $V_{mid2}$ and adding $V^{ref}/2^m$ (475).

After digital signals $Sb0_n$ and $Sb1_n$ are set and $V_{in2}$ is adjusted, n is incremented by one (480) and then the incremented n is compared against a value "P+Q" to determine if n is less than or equal to P+Q (485). The value Q is the number of cycles to be executed by the cyclic ADC. If n is less than or equal to P+Q (485 Yes), then a next cyclic ADC cycle begins by comparing $V_{in2}$ to $V_{cmp1}$ and $V_{cmp2}$ (430). If n is greater than P+Q (485 No), then the cyclic ADC cycles have been completed and the ADC processing is complete.

The digital signals $Sb0_n$ and $Sb1_n$ from the SAR (e.g., 216) and the digital signals $Sb0_n$ and $Sb1_n$ from the CC (e.g., 240) are provided to a DCC (e.g., 250). The DCC receives the digital signals and creates a corrected digital value. During each cycle of the hybrid ADC (e.g., 200) the DCC receives two digital signals. The signals received the next cycle are shifted one digit so that a second digital signal (e.g., $Sb0_n$) of one cycle aligns with a first digital signal of a next cycle (e.g., $Sb1_n$). Once all signals have been received the digital signals received are added together. The addition is performed according to the location of the digits.

FIG. 5 illustrates an example output of a DCC (e.g., 250). The outputs from each cycle of the hybrid ADC may be placed in an array. The outputs may initially be placed in first two columns of a first row and be shifted one row and one column each cycle. The example is based on a hybrid ADC that uses three successive approximation ADC cycles and five cyclic ADC cycles. The digital bit values $Sb0_1$ and $Sb1_1$ from a first successive approximation cycle are placed in first two column positions in a first row, the digital bit values $Sb0_2$ and $Sb1_2$ from a second successive approximation cycle are shifted to second and third columns of a second row, and the digital bit values $Sb0_3$ and $Sb1_3$ from a third successive approximation cycle are shifted to third and fourth columns of a third row. The digital bit values $Cb0_4$ and $Cb1_4$ from a first cyclic ADC cycle are shifted to fourth and fifth columns of fourth row and continues in a similar manner until the last digital bit values $Cb0_8$ and $Cb1_8$ from a fifth cyclic ADC cycle are shifted to eighth and ninth columns of an eighth row. After all of the ADC cycles are complete, the columns of array are summed to yield a final digital output ($D_0$–$D_8$). The summation is carried out from the ninth column (least significant bit) to the first column (most significant bit). For example, column 9 would equal $Cb1_8$, column 8 would equal sum of $Cb0_8$ and $Cb1_7$ and so one with any carryover from one column going to next significant column. As can be seen an eight cycle ADC generates a nine (and possibly 10 based on carryover) bit digital signal.

FIG. 6 illustrates an example application of a hybrid ADC (e.g., 200). The example assumes an input voltage ($V_{in}$) of 0.6V, a reference voltage ($V_{ref}$) of 1.0 V, and a hybrid ADC that uses three SAR ADC cycles and five cyclic ADC cycles. The operation will be discussed with reference to FIGS. 3 and 4. During a first cycle, n=1 (310), $V_{ref}$ is divided by 2 to set $V_{mid}$ at 500 mV (310). The offset voltage $V_{ref}/2^{n+2}$ is determined to be 125 mV (1V/8). $V_{cmp1}$ is set to 625 mV by adding the offset to $V_{mid}$ (315) and $V_{cmp2}$ is set to 375 mV by subtracting the offset from $V_{mid}$ (320). The comparison of $V_{in}$ to $V_{cmp1}$ and $V_{cmp2}$ (325) generates digital signals $Sb0_1=0$ and $Sb1_1=1$ (350) as $V_{in}$ is between $V_{cmp1}$ and $V_{cmp2}$ (345).

n is incremented to 2 (370) and the process continues with a second SAR cycle (375 yes). The offset voltage $V_{ref}/2^{n+2}$ is determined to be 62.5 mV (1V/16) so that $V_{cmp1}$ is set to 562.5 mV and $V_{cmp2}$ is set to 437.5 mV. The comparison of $V_{in}$ to $V_{cmp1}$ and $V_{cmp2}$ generates digital signals $Sb0_2=1$ and $Sb1_2=0$ (335) as $V_{in}$ is greater than $V_{cmp1}$ (330). $V_{mid}$ is increased by $V_{ref}/2^{n+2}$ (125 mV) to 625 mV (340).

n is incremented to 3 and the process continues with a third SAR cycle. The offset voltage $V_{ref}/2^{n+2}$ is determined to be 31.25 mV (1V/32) so that $V_{cmp1}$ is set to 656.25 mV (625+31.25) and $V_{cmp2}$ is set to 593.75 mV (625−31.25). The comparison of $V_{in}$ to $V_{cmp1}$ and $V_{cmp2}$ (325) generates digital signals $Sb0_3=0$ and $Sb1_3=1$ (350) as $V_{in}$ is between $V_{cmp1}$ and $V_{cmp2}$.

n is incremented to 4 and the process shifts to a first cyclic cycle (375 No). m is set equal to n so that m is locked into 4 for the duration of the cyclic cycles and $V_{mid2}$ is locked at $V_{ref}/2$ (405). A second input voltage ($V_{in2}$) is set to 475 mV by subtracting $V_{mid}$ (625 mV) and adding $V_{mid2}$ (500 mV) to $V_{in}$ (600 mV) (410). The offset voltage $V_{ref}/2^{m+2}$ is determined to be 15.625 mV (1V/64). $V_{cmp1}$ is set to 515.625 mV by adding the offset to $V_{mid2}$ (420) and $V_{cmp2}$ is set to 484.375 mV by subtracting the offset from $V_{mid2}$ (425). The comparison of $V_{in2}$ to $V_{cmp1}$ and $V_{cmp2}$ (430) generates digital signals $Cb0_4=0$ and $Cb1_4=0$ (470) as $V_{in2}$ is less than $V_{cmp2}$ (465). $V_{in2}$ is set to 512.5 mV by subtracting $V_{mid2}$ from and adding $V_{ref}/2^m$ to 2 times $V_{in2}$, (2*475)−500+62.5 (475).

n is incremented to 5 (480) and the process continues with a second cyclic cycle (485 yes). The comparison of $V_{in2}$ to $V_{cmp1}$ and $V_{cmp2}$ generates digital signals $Cb0_5=0$ and $Cb1_5=1$ (455) as $V_{in2}$ is between $V_{cmp1}$ and $V_{cmp2}$ (450). $V_{in2}$ is set to 525 mV by subtracting $V_{mid2}$ from 2 times $V_{in2}$, (2*512.5)−500 (460).

n is incremented to 6 and the process continues with a third cyclic cycle. The comparison of $V_{in2}$ to $V_{cmp1}$ and $V_{cmp2}$ generates digital signals $Cb0_6=1$ and $Cb1_6=0$ (440) as $V_{in2}$ is greater than $V_{cmp1}$ and $V_{cmp2}$ (435). $V_{in2}$ is set to 487.5 mV by subtracting $V_{mid2}$ and $V_{ref}/2^m$ from 2 times $V_{in2}$, (2*525)−500−62.5 (445).

n is incremented to 7 and the process continues with a fourth cyclic cycle. The comparison of $V_{in2}$ to $V_{cmp1}$ and $V_{cmp2}$ generates digital signals $Cb0_7=0$ and $Cb1_7=1$ as $V_{in2}$ is between $V_{cmp1}$ and $V_{cmp2}$. $V_{in2}$ is set to 475 mV by subtracting $V_{mid2}$ from 2 times $V_{in2}$, (2*487.5)−500.

n is incremented to 8 and the process continues with a fifth cyclic cycle. The comparison of $V_{in2}$ to $V_{cmp1}$ and $V_{cmp2}$ generates digital signals $Cb0_8=0$ and $Cb1_8=0$ as $V_{in2}$ is less than $V_{cmp2}$. $V_{in2}$ is set to 512.5 mV by subtracting $V_{mid2}$ from and adding $V_{ref}/2^m$ to 2 times $V_{in2}$, (2*475)−500+62.5. n is incremented to 9 and the cyclic process ends as 9>8 (P+Q, 3+5) (485 No).

The digits received by the DCC (e.g., 250) are now summated from least significant bit (right most bit) to most significant bit (left most bit) resulting in a corrected digital output code of 100110010 (9 bits for 8 cycles).

A hybrid ADC (e.g., 200) may be used various types of integrated circuits (ICs). As the hybrid ADC is low power it may be utilized in mobile ICs that require batteries to provide the power as reducing the power consumption will save the battery life. Mobile ICs may be used in any number of mobile devices including but not limited to laptop computes, cell phones, personal digital assistants (PDAs), gaming consoles, and portable entertainment devices. The mobile devices may include one or more mobile processors to operate the device. The processors may include on die memory, may utilize off die memory, or some combination thereof. The mobile devices may include an antenna for communications and a battery for power.

Although the various embodiments have been illustrated by reference to specific embodiments, it will be apparent that various changes and modifications may be made. Reference to "one embodiment" or "an embodiment" means that a particular feature, structure or characteristic described in connection with the embodiment is included in at least one embodiment. Thus, the appearances of the phrase "in one embodiment" or "in an embodiment" appearing in various places throughout the specification are not necessarily all referring to the same embodiment.

Different implementations may feature different combinations of hardware, firmware, and/or software. It may be possible to implement, for example, some or all components of various embodiments in software and/or firmware as well as hardware, as known in the art. Embodiments may be implemented in numerous types of hardware, software and firmware known in the art, for example, integrated circuits, including ASICs and other types known in the art, printed circuit broads, components, etc.

The various embodiments are intended to be protected broadly within the spirit and scope of the appended claims.

What is claimed:

1. A hybrid analog-to-digital converter comprising:
   a successive approximation analog-to-digital converter to receive an analog input signal and generate at least one bit of a digital output signal; and
   a cyclic analog-to-digital converter, coupled to the analog input signal and said successive approximation analog-to-digital converter, to generate at least one additional bit of the digital output signal.

2. The converter of claim 1, further comprising a digital correction circuit coupled to said successive approximation analog-to-digital converter and said cyclic analog-to-digital converter to generate a corrected digital output signal.

3. The converter of claim 1, wherein said successive approximation analog-to-digital converter operates for at least a first cycle and said cyclic analog-to-digital converter operates for at one additional cycle after said successive approximation analog-to-digital converter.

4. The converter of claim 3, wherein two digital bits are generated each cycle.

5. The converter of claim 1, wherein said successive approximation analog-to-digital converter includes
   a successive approximation register;
   a first digital-to-analog converter coupled to a first output of the successive approximation register;
   a second digital-to-analog converter coupled to a second output of the successive approximation register;
   a first comparator coupled to the analog input signal, an output of the first digital-to-analog converter, and a first input to the successive approximation register; and
   a second comparator coupled to the analog input signal, an output of the second digital-to-analog converter, and a second input of the successive approximation register.

6. The converter of claim 5, wherein said cyclic analog-to-digital converter includes
   a circuit to receive and transform the analog input signal;
   a switch with a first input coupled to an output of the circuit;
   a third comparator coupled to an output of the switch and the output of the first digital-to-analog converter;
   a fourth comparator coupled to the output of the switch and the output of the second digital-to-analog converter;
   a cyclic control circuit coupled an output of the third comparator and an output of the fourth comparator; and
   a multiplier coupled to an output of the cyclic control circuit and a second input of the switch.

7. The converter of claim 6, wherein the multiplier multiplies the output of the cyclic control circuit by a factor of two.

8. The converter of claim 2, wherein said successive approximation analog-to-digital converter generates two bits of the digital signal each cycle for a first selected amount of cycles, wherein said cyclic analog-to-digital converter generates two bits of the digital signal each cycle for a second selected amount of cycles, and wherein the two bits generated are shifted one bit each cycle.

9. The converter of claim 8, wherein said digital correction circuit summates the bits received from least significant bit to most significant bit.

10. A method comprising:
    receiving an analog input signal;
    generating a most significant portion of a digital signal by converting the analog input signal using a successive approximation analog-to-digital converter, wherein the most significant portion is at least one bit; and
    generating a least significant portion of the digital signal by converting the analog input signal using a cyclic analog-to-digital converter, wherein the most significant portion is at least one bit.

11. The method of claim 10, further comprising:
    generating a corrected digital signal by shifting and summing the most significant portion generated by the successive approximation analog-to-digital converter and the least significant portion generated by the cyclic analog-to-digital converter.

12. The method of claim 10, wherein said generating a most significant portion includes
    computing a first comparison signal;
    computing a second comparison signal;
    comparing the analog input signal to the first comparison signal and the second comparison signal;
    generating at least one bit of the most significant portion based on the comparing;
    repeating the computing, the comparing, and the generating until the most significant portion is complete.

13. The method of claim 12, wherein said generating a least significant portion includes
    transforming the analog input signal;
    computing a third comparison signal;
    computing a fourth comparison signal;
    comparing the transformed analog input signal to the third comparison signal and the fourth comparison signal;
    generating at least one bit of the least significant portion based on the comparing;
    repeating the comparing, and the generating until the least significant portion is complete.

14. The method of claim 10, wherein
    said generating a most significant portion includes generating two bits of the digital signal each cycle for a first selected amount of cycles; and
    said generating a most significant portion includes generating two bits of the digital signal each cycle for a second selected amount of cycles, and wherein the two bits generated are shifted one bit each cycle.

15. A hybrid analog-to-digital converter comprising:
    a successive approximation register to generate first digital control signals;
    a pair of digital-to-analog converters coupled to said successive approximation register;
    a first pair of comparators to compare an analog input signal and respective outputs of said pair of digital-to-analog converters and provide results of comparison to said successive approximation register;
    a cyclic control circuit to generate second digital control signals;
    a second pair of comparators to compare an updated analog input signal and respective outputs of said pair of digital-to-analog converters and provide results of comparison to said cyclic control circuit; and
    a digital correction circuit to generate a corrected digital output signal based on the first digital control signals and the second digital control signals.

16. The converter of claim 15, wherein the pair of digital-to-analog converters are of a switched-capacitor type.

17. The converter of claim 15, wherein said successive approximation register generates two bits each cycle for a first selected amount of cycles to generate the first digital signals, wherein said cyclic control circuit generates two bits each cycle for a second selected amount of cycles to generate the second digital signals, and wherein the two bits generated are shifted one bit each cycle.

18. A system comprising:
    a processing die including:
       a successive approximation analog-to-digital converter to receive an analog input signal and generate at least one bit of a digital output signal; and
       a cyclic analog-to-digital converter, coupled to the analog input signal and said successive approximation analog-to-digital converter, to generate at least one additional bit of the digital output signal; and
    an antenna for communications.

19. The system of claim 18, wherein the signal processing die further includes a digital correction circuit, coupled to the successive approximation analog-to-digital converter and the cyclic analog-to-digital converter, to generate a corrected digital output signal.

20. The system of claim 18, wherein the successive approximation analog-to-digital converter generates two bits each cycle for a first selected amount of cycles, wherein the cyclic analog-to-digital converter generates two bits each cycle for a second selected amount of cycles after completion of the first selected amount of cycles, and wherein the two bits generated are shifted one bit each cycle.

* * * * *